United States Patent
Montgomery et al.

(10) Patent No.: US 9,991,120 B2
(45) Date of Patent: Jun. 5, 2018

(54) DILUTION DOPED INTEGRATED CIRCUIT RESISTORS

(71) Applicant: Texas Instruments Incorporated, Dallas, TX (US)

(72) Inventors: Scott K. Montgomery, Rowlett, TX (US); Scott R. Summerfelt, Garland, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days. days.

(21) Appl. No.: 14/576,680

(22) Filed: Dec. 19, 2014

(65) Prior Publication Data

US 2015/0187583 A1    Jul. 2, 2015

Related U.S. Application Data

(60) Provisional application No. 61/921,613, filed on Dec. 30, 2013.

(51) Int. Cl.
| | |
|---|---|
| *H01L 21/8234* | (2006.01) |
| *H01L 21/266* | (2006.01) |
| *H01L 49/02* | (2006.01) |
| *H01L 27/06* | (2006.01) |

(52) U.S. Cl.
CPC ........ *H01L 21/266* (2013.01); *H01L 27/0629* (2013.01); *H01L 28/20* (2013.01)

(58) Field of Classification Search
CPC ......... H01L 28/20; H01L 28/22; H01L 28/24; H01L 28/26; H01L 21/027; H01L 21/0334; H01L 21/0338; H01L 21/266; H01L 21/265; H01L 27/0802
See application file for complete search history.

(56) References Cited

U.S. PATENT DOCUMENTS

| | | | | |
|---|---|---|---|---|
| 6,403,438 | B1* | 6/2002 | Santangelo | ......... H01C 17/003 257/E21.004 |
| 6,500,723 | B1* | 12/2002 | Khazhinsky | ........ H01L 21/2253 257/E21.004 |
| 7,241,663 | B2* | 7/2007 | Howard | .................. H01L 28/20 257/E21.004 |
| 2001/0038128 | A1* | 11/2001 | Woolery | ............. H01L 27/0288 257/363 |
| 2007/0281418 | A1* | 12/2007 | Hu | ...................... H01L 27/0629 438/238 |
| 2010/0019328 | A1* | 1/2010 | Zhang | .................... H01L 28/20 257/380 |
| 2014/0231960 | A1* | 8/2014 | Kim | ........................ H01L 28/20 257/536 |

* cited by examiner

*Primary Examiner* — Selim Ahmed
*Assistant Examiner* — Evan Clinton
(74) *Attorney, Agent, or Firm* — Jacqueline J. Garner; Charles A. Brill; Frank D. Cimino (57) ABSTRACT

A process for forming an integrated circuit with a dilution doped resistor with a resistance that may be tuned by partially blocking the implant used to dope the resistor. A process for forming an integrated circuit with a dilution doped polysilicon resistor by partially blocking the resistor dopant implant from a portion of the polysilicon resistor body.

15 Claims, 9 Drawing Sheets

DILUTION DOPED INTEGRATED CIRCUIT RESISTORS

CROSS-REFERENCE TO RELATED APPLICATIONS

This application claims the benefit of priority under U.S.C. § 119(e) of U.S. Provisional Application 61/921,613, the contents of which are hereby incorporated by reference.

FIELD OF INVENTION

This invention relates to the field of integrated circuits. More particularly, this invention relates to resistors in integrated circuits.

BACKGROUND

Resistors that are used in integrated circuits to set voltage levels and to determine signal delays are typically formed during the manufacture of integrated circuits. These resistors are typically formed using wells, diffusions within wells, or formed using doped polysilicon. Doped polysilicon resistors are preferred because unlike well resistors and diffusion resistors which have significant diode capacitance the doped polysilicon resistors may be formed on thick isolation oxide with very low capacitance.

To reduce cost, resistors are usually formed using masking steps and implantation steps that are already in the integrated circuit manufacturing flow. For example an nwell resistor may be formed using the nwell patterning and nwell implantation steps also used to form p-type metal-oxide-semiconductor (PMOS) transistors. A diffused n-type resistor may be formed using the n-type source and drain patterning and n-type source and drain implantation steps also used to form n-type metal-oxide-semiconductor (NMOS) transistors. A polysilicon resistor may be formed at the same time as the polysilicon transistor gates and may use the polysilicon gate doping or the source and drain doping. By using existing patterning steps and implantation steps additional cost to form resistors may be avoided.

Since the resistance of the resistor material is determined by the doping concentration, the resistance of the resistor is determined by the length of the resistor body. If high resistance is needed, a very long resistor body may be required. Large area increases cost. To reduce the resistor area and resistor cost lower resistor doping would be required, but this would add an additional resistor doping patterning and implantation steps which also adds cost.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A resistor with tunable resistance is formed in an integrated circuit with no added processing steps by partially blocking resistor dopant from the body of the resistor. A dilution doped polysilicon resistor with tunable resistance is formed in an integrated circuit with no added processing steps by partially blocking resistor dopant from the body of the resistor.

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The resistance of a resistor may be increased by partially blocking implanted dopant from a portion of the body of the resistor. Partially blocking implant doping is termed "dilution doping" to form a "dilution doped" resistor. The increase in resistance of dilution doped resistors enables the resistor to be formed in a smaller area thus reducing die area and reducing cost. This embodiment method allows the resistance of a resistor to be tuned as desired without adding resistor patterning and implantation steps by using an implant that already exists in the baseline CMOS process flow.

Figure 1:
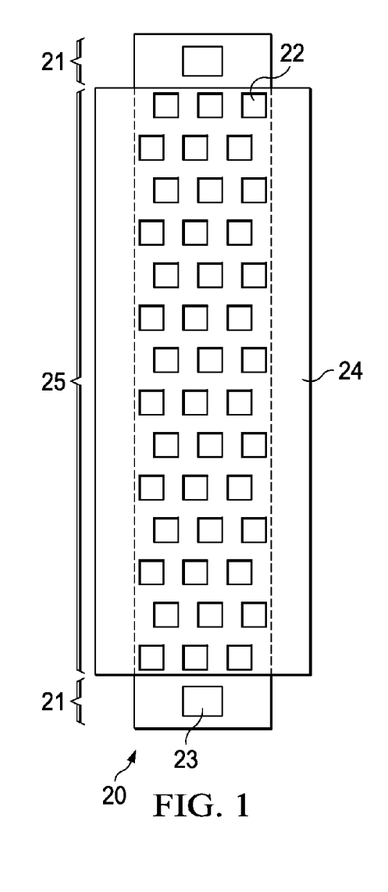
FIG. 1 is a top down view of an embodiment diluted dopant resistor.
Figure 2:
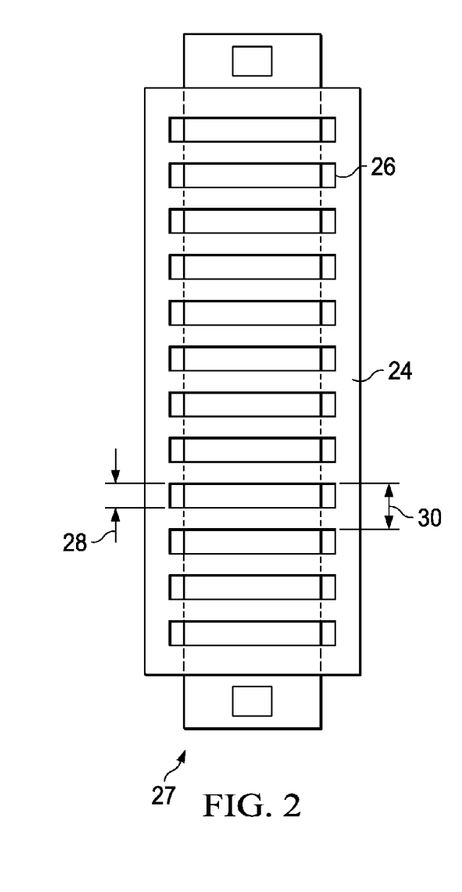
FIG. 2 is a top down view of an embodiment diluted dopant resistor.
Figure 3:
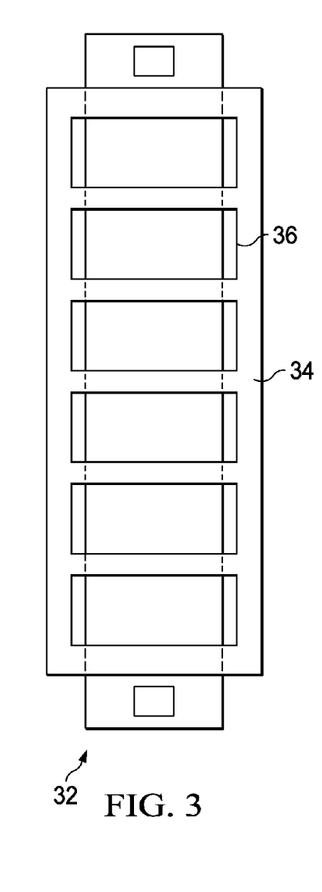
FIG. 3 is a top down view of an embodiment diluted dopant resistor.

Top down views of dilution doped resistors formed according to embodiments are shown in FIGS. 1, 2 and 3. Dilution doping of the embodiment resistors enables resistors with higher resistance values to be formed and therefore to reduce the area required to form the resistor.

The embodiment dilution doped resistor 20 in FIG. 1 may be formed of material such as single crystal silicon or poly silicon. The resistor 20 is comprised of a resistor body 25 and resistor heads 21. Electrical contact 23 is made to the resistor heads 21. Doping may be added to the resistor body 20 by implanting resistor dopant through openings 22 in resistor implant blocking photoresist 24. By partially blocking the resistor dopant, less resistor doping is added to the resistor body 25 than is typical with a blanket implant. In this manner a dilution doped resistor with higher resistance may be formed. By adjusting the size and pitch of the openings 22 through which the resistor dopant is implanted, a specified resistance value for the resistor 20 may be achieved. Thermal drive may be used to diffuse the resistor dopant throughout the resistor body 25 to create a resistor with uniform doping. (Uniform doping is not required.) A layer of silicide block material, may be formed over the body 25 of the embodiment resistor 20 to block silicide formation on the body 25 of the resistor which would short out the resistor. Source and drain dopant may be implanted into the heads 21 and silicide may be formed on heads 21 to form low resistance electrical contacts 23 to the embodiment resistor 20.

Another embodiment dilution doped resistor is shown in FIG. 2. Instead of a plurality of square or rectangular openings 22 with dimensions less than the width of the resistor body in the implant blocking resist 24 as in FIG. 1, rectangular openings 26 which span the width of the embodiment resistor 27 may be used. Dopants implanted into these rectangular openings 26 may then be annealed to form a resistor with higher resistance than is possible when the resistor 27 is uniformly doped with a blanket dopant implant. The width 28 and pitch 30 of the openings 26 in the implant blocking resist the resistance of the resistor body may be changed as desired to achieve the desired resistance value.

An additional embodiment dilution doped resistor is shown in FIG. 3. In this embodiment the resistor 32 body 25 is first lightly doped with a blanket implant such as a lightly doped drain extension implant before additional doping is added through openings 36 in the implant blocking resist 34. In this example, additional doping may be added through rectangular openings 36 in the implant blocking resist 34. Openings 22 which partially span the resistor body as shown in FIG. 1 may also be used for the additional doping. This gives the process integration engineer additional options to achieve the desired resistance using implants that already exist in the integrated circuit CMOS process flow.

FIGS. 1, 2, and 3 are three examples of partially blocked implant patterns for forming embodiment dilution doped resistor. Many other designs are possible. In some cases the openings in the implant blocking resist are placed close together so that uniform embodiment resistor body doping is achieved after anneal. In other cases the openings are placed farther apart with the result that the final doping in the embodiment resistor body may be nonuniform post anneal. In some cases the final resistor may have regions of low resistance and high resistance in series. In other cases the final resistor may have regions of low resistance and high resistance in parallel.

More than one partially blocked implant may be utilized to form a resistor.

An example process flow illustrating the formation of embodiment dilution doped resistors is shown in FIGS. 4A through 4J. The flow illustrates the formation of an embodiment dilution doped well resistor, an embodiment dilution doped diffusion resistor, and an embodiment dilution doped polysilicon resistor. Although a process flow in which three types of dilution doped resistors are illustrated, process flows with one or two of the dilution doped resistors are also possible. The dilution doped resistors may be added to a baseline manufacturing flow with no additional cost.

Figure 4A:
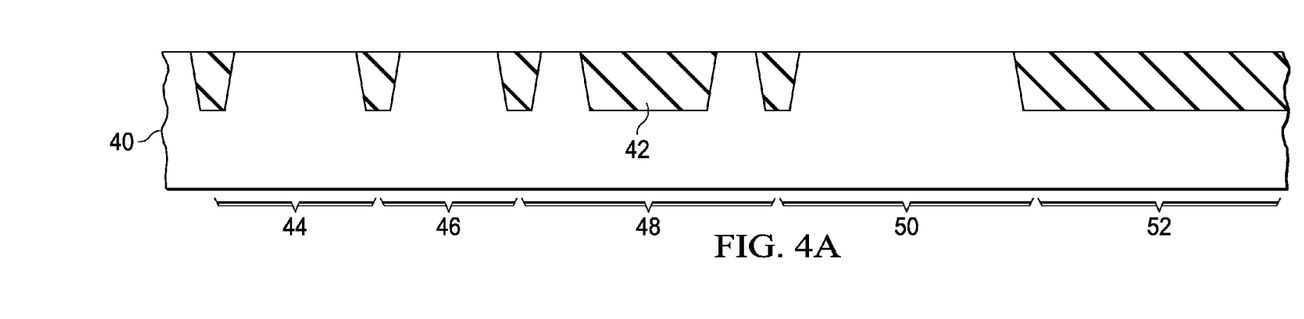
FIGS. 4A-4J are illustrations of steps in the fabrication of diluted dopant resistors in an integrated circuits according to principles of the invention.

FIG. 4A shows a cross section of an integrated circuit that has been processed through shallow trench isolation (STI). STI geometries 42 are formed in a semiconductor substrate 40. To illustrate the embodiments a p-type substrate 40 with the formation of an embodiment nwell resistor, the formation of an embodiment n-type diffusion resistor, and the formation of an embodiment n-type polysilicon resistor 52 is used. An n-type substrate with embodiment resistors with other doping types may also be used. Other implantation steps that exist in a baseline integrated circuit flow may also be used to form embodiment resistors. The implantations steps used are for illustration only and not intended to limit the invention in any way.

In FIG. 4A a PMOS transistor is formed in region 44, an NMOS transistor is formed in region 46, an nwell dilution doped resistor is formed in region 48, a dilution doped n-type diffusion resistor is formed in region 50 and an n-type dilution doped polysilicon resistor is formed in region 52.

Figure 4B:
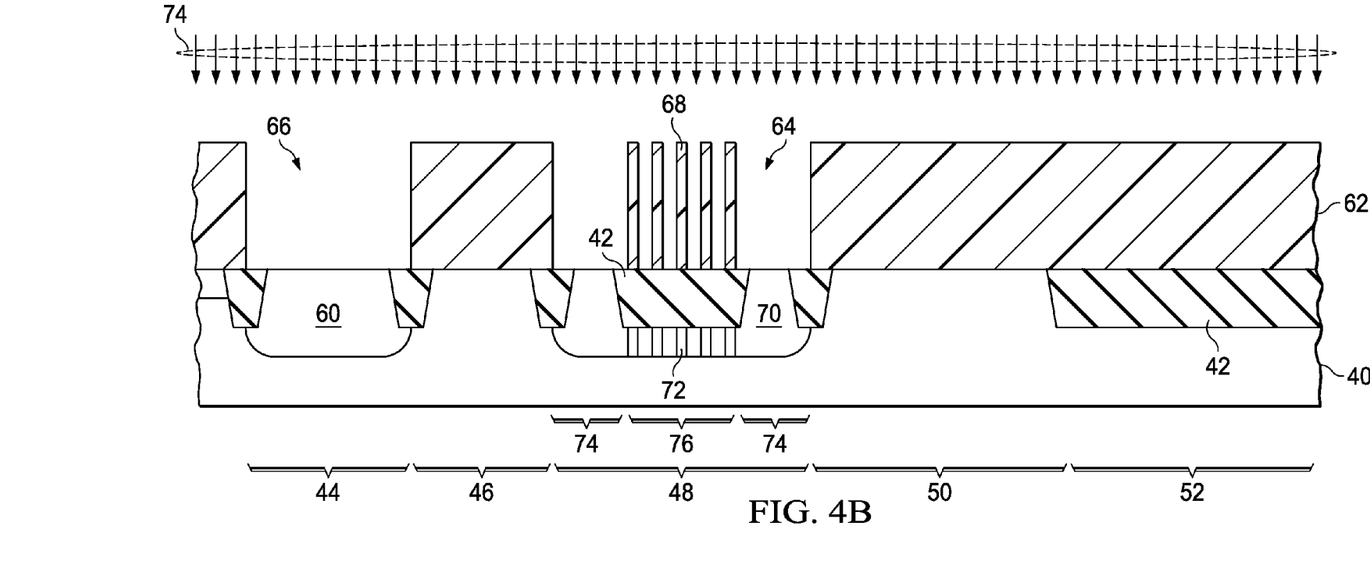

Referring now to FIG. 4B an nwell photoresist pattern 62 is formed on the surface of the integrated circuit and n-type dopant 74 such as phosphorus is implanted into opening 66 to form nwell 60 in which a PMOS transistor is to be formed and also into opening 64 in which an nwell 70 for a dilution doped nwell resistor 48 is to be formed. Resist geometries 68 block dopant from portions of the body 76 of the dilution doped resistor nwell 70 to form p-type regions 72 with substrate 40 doping. The blocked areas 72 may be similar to those shown in FIG. 1 or FIG. 2 for example. Electrical contact is formed to the heads 74 of the dilution doped nwell resistor 48.

Figure 4C:
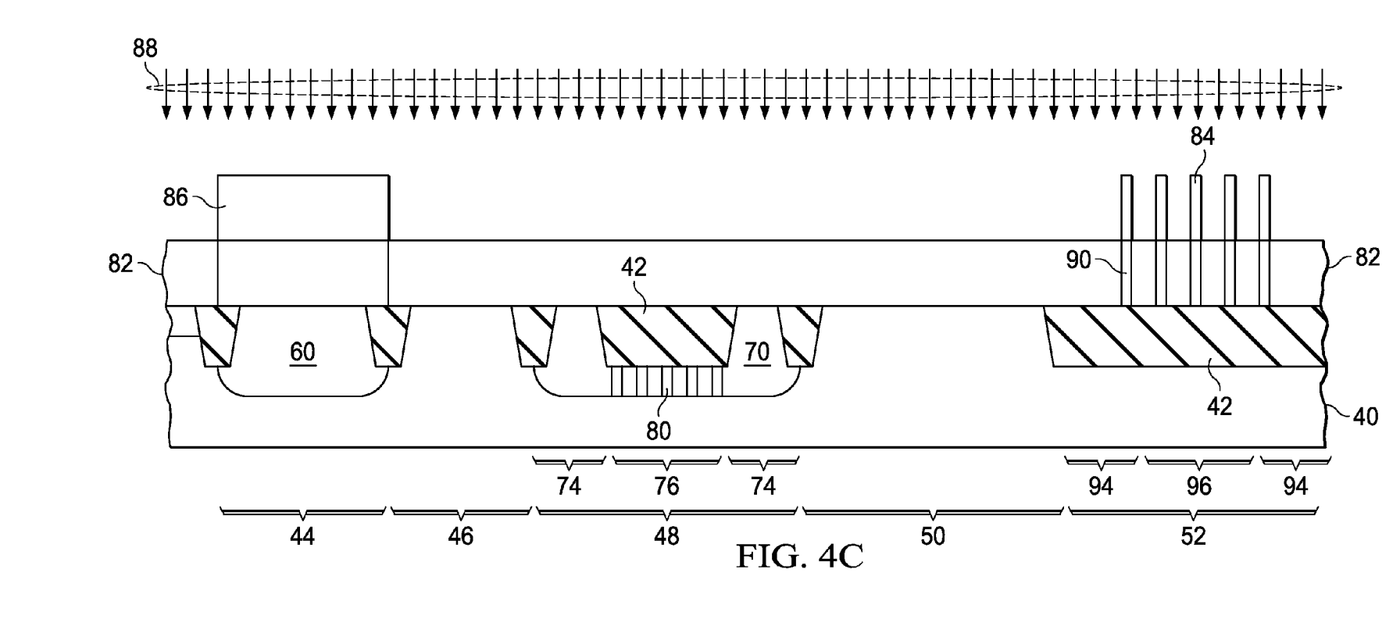

FIG. 4C shows the integrated circuit after an anneal has been performed to drive and activate the n-type dopant 74 to form the nwell 60 and the dilution doped nwell resistor 48. The anneal drives the n-type dopant 74 into the p-type regions 72 (FIG. 4B) of the body 76 counterdoping these regions from p-type 72 to n-type 80. Depending upon the size and spacing of the blocking geometries 68 (FIG. 4B) and the thermal drive, the final doping in the body 76 of the embodiment nwell resistor may be uniform or may be non uniform. The resistance of the body of the embodiment nwell resistor 48 and the resistance uniformity may be determined by the size and spacing of the implant blocking geometries 68.

After the nwell 60 and dilution doped nwell resistor 48 are formed, gate dielectric and polysilicon gate material 82 are formed on the integrated circuit as shown in FIG. 4C. A polysilicon gate doping pattern 86 is formed on the surface of the polysilicon 82 and doped with n-type doping 88 to set the workfunction of the NMOS transistor gate (NMOS transistor is formed in region 46) and also to dope the dilution doped n-type resistor formed in region 52. Implant blocking geometries 84 block the n-type dopant 88 from portions of the dilution doped polysilicon resistor body 96 forming regions of undoped poly 90. Although the polysilicon gate doping implant 88 is used to illustrate the dilution doped polysilicon resistor 52 formation, a source and drain (NSD or PSD) pattern and NSD or PSD implant doping may be used instead.

Figure 4D:
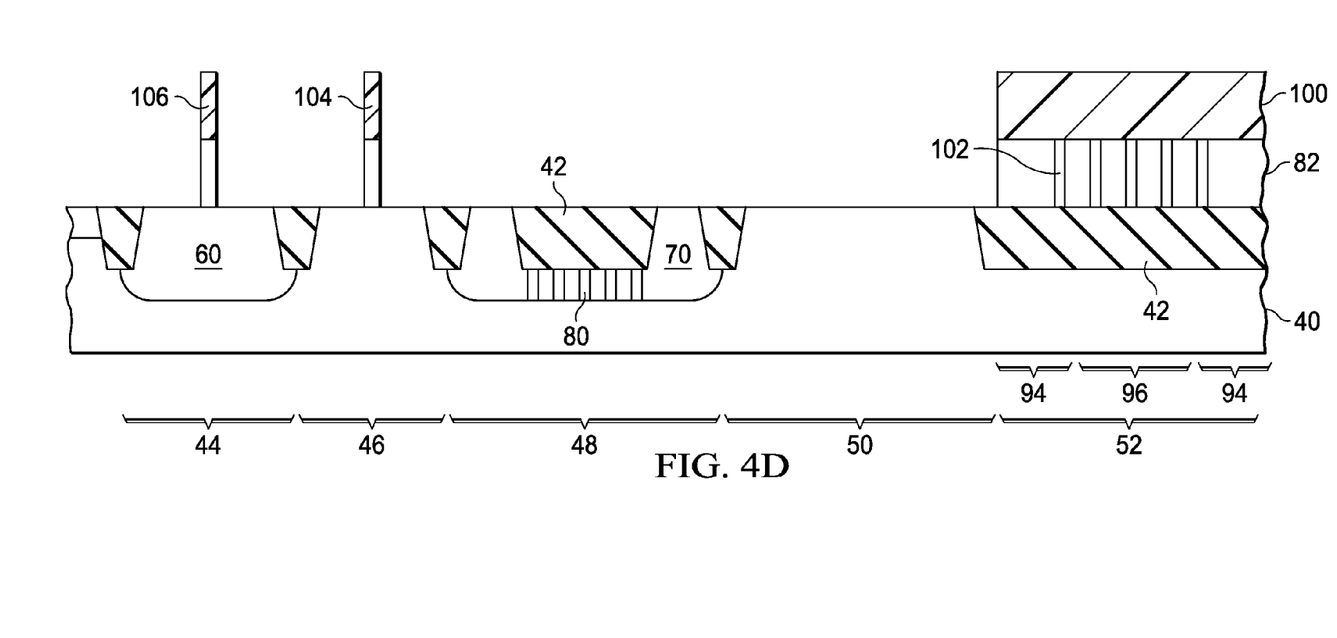

As is illustrated in FIG. 4D, an anneal activates the dopant and drives the dopant into the undoped regions 90 (FIG. 4C) of the body dilution doped polysilicon resistor body 96 doping these regions 102 of the body n-type. Depending upon the width and spacing of the implant blocking geometries 84 and upon the time and temperature of the activation anneal, the body 96 of the dilution doped polysilicon resistor 52 may be uniformly doped or may be non uniformly doped. The final resistance of the body 96 of the dilution doped polysilicon resistor 52 may be selected by adjusting the width and spacing of the implant blocking geometries 84.

Gate pattern 100 is then formed on the polysilicon layer 82 and the polysilicon 82 is etched to form the PMOS transistor gate 106, the NMOS transistor gate 104 and the embodiment polysilicon resistor 52.

Figure 4E:
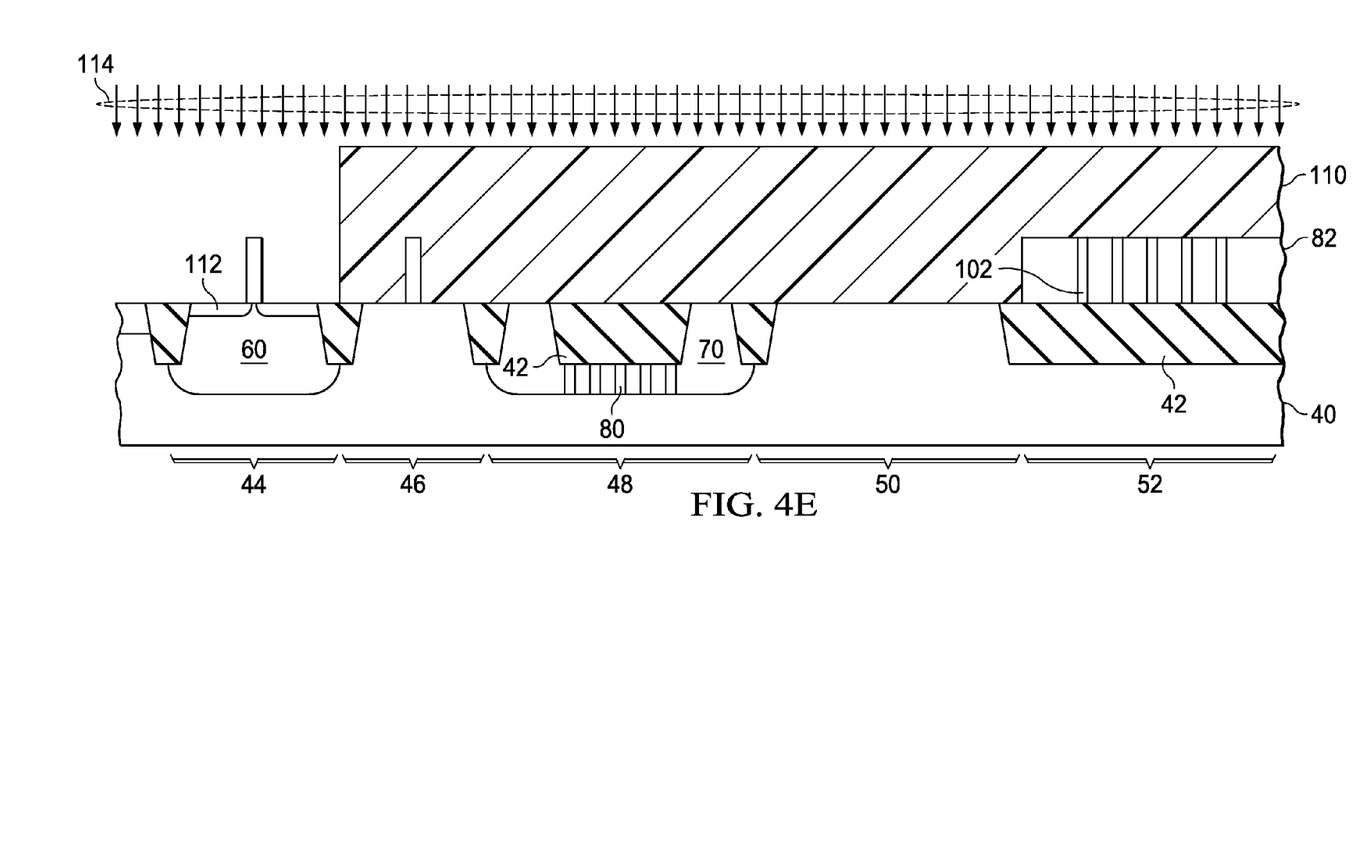

Referring now to FIG. 4E a PSD extension pattern 110 is formed on the surface of the integrated circuit and p-type dopant 114 such as boron or $BF_2$ is implanted to form source and drain extensions 112 on the PMOS transistor. In this example embodiment, the implant 114 is blocked from the NMOS transistor area 46 and the embodiment diffused resistor region 50.

Figure 4F:
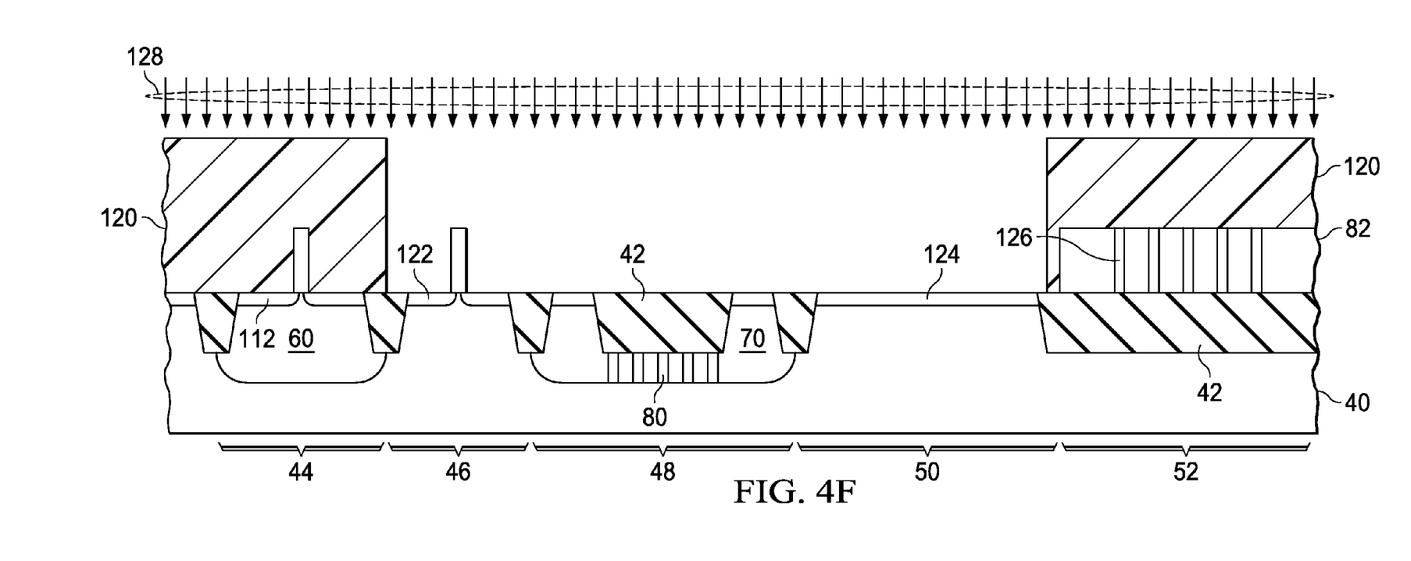

In FIG. 4F a NSD extension photoresist pattern 120 is formed on the surface of the integrated circuit and an n-type dopant 128 such as arsenic or phosphorus is implanted to form source and drain extensions 122 on the NMOS transistor 46. Optionally this dopant 128 may also be implanted into the dilution doped resistor region 50 (shown in FIG. 4F) and the dilution doped polysilicon resistor 52 (not shown in FIG. 4F) to provide a uniform light doping to reduce resistance.

Figure 4G:
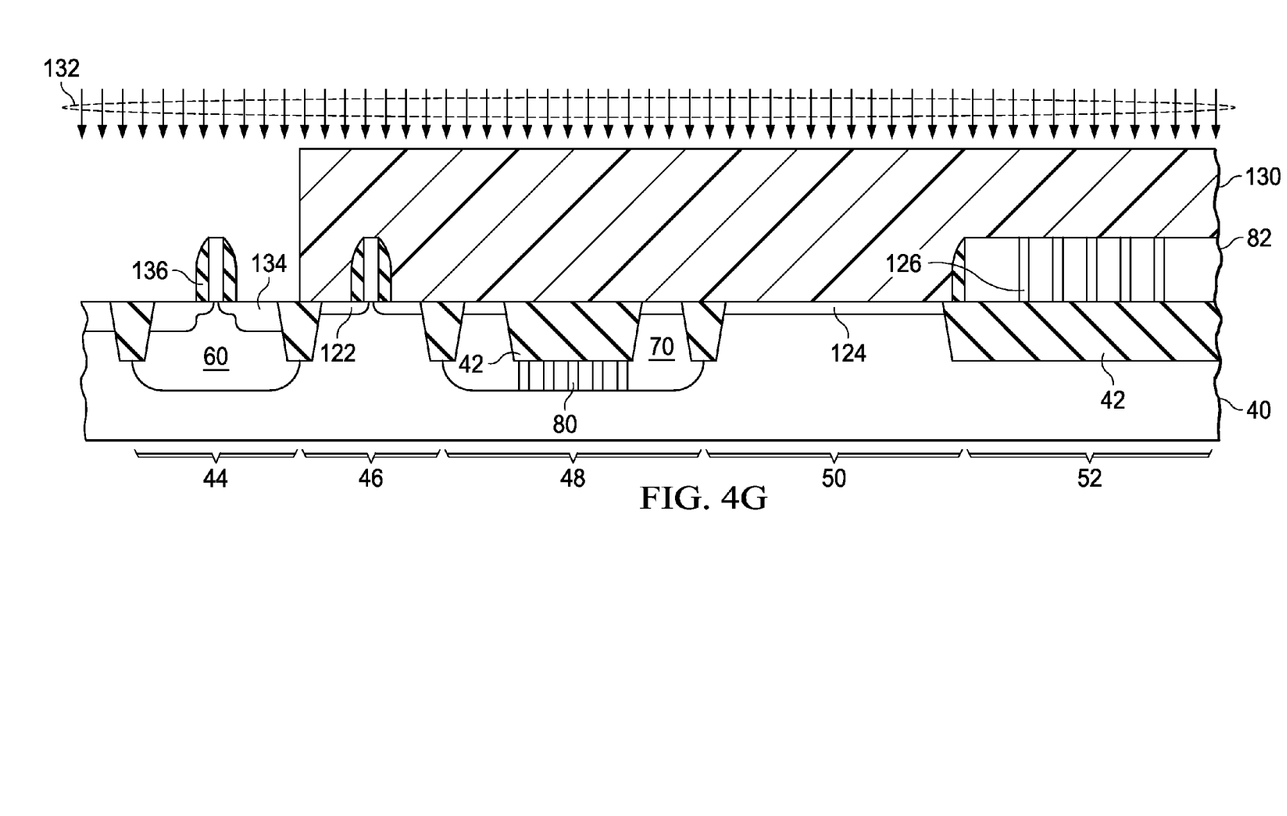

In FIG. 4G sidewalls 136 are formed on the vertical sides of the polysilicon geometries by depositing a dielectric such as silicon dioxide or silicon nitride (or layers of silicon dioxide and silicon nitride) and anisotropically etching the dielectric using conventional semiconductor processing techniques.

A p-type source and drain (PSD) photoresist pattern 130 is the formed on the surface of the integrated circuit in FIG. 4G and a p-type dopant 132 such as boron-11 or $BF_2$ is implanted to form the deep source and drain diffusions 134 on the PMOS transistor 44.

Figure 4H:
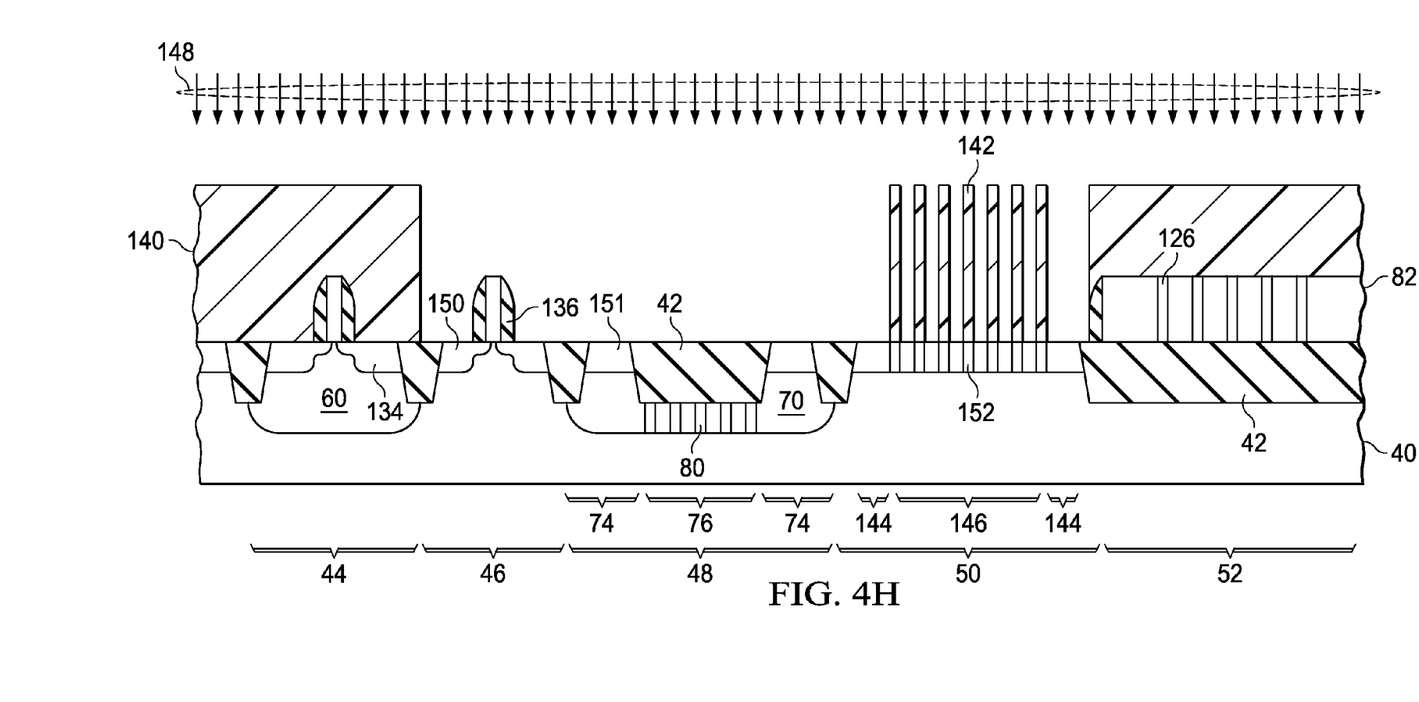

Referring now to FIG. 4H a NSD photoresist pattern 140 is formed on the surface of the semiconductor with an opening over the NMOS transistor 46 to form the deep source and drain diffusions 150, an opening over the dilution doped nwell resistor area 48 to form low resistance contact areas 151 in the heads 74 of the dilution doped nwell resistor, and an opening over the dilution doped diffused resistor area 50 to dope the dilution doped diffused resistor body 146 and head 144 regions. Implant blocking geometries 142 partially block the implant 148 from the body 146 of the dilution doped diffused resistor 50 to form regions 152 with p-type doping of the substrate 40. The size and pitch of the implant blocking geometries 142 determines how much dopant is implanted into the body 146 of the dilution doped diffused resistor and may be adjusted to achieve the desired resistance. The size and pitch of the implant blocking geometries 142 combined with the time and temperature of the source and drain anneal determines whether the body of the dilution doped diffused resistor ends up being uniformly doped or non uniformly doped.

Figure 4I:
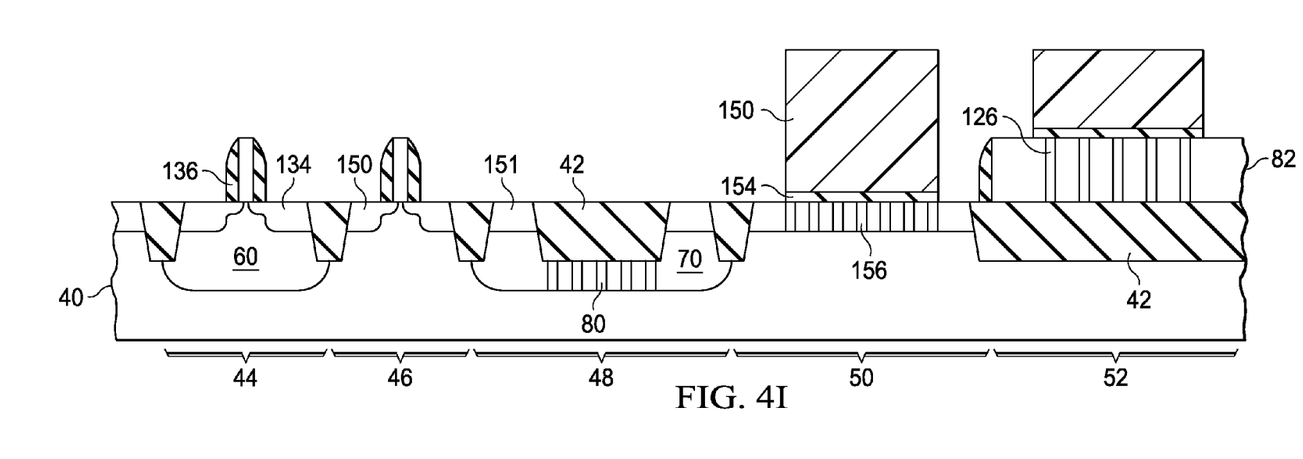

FIG. 4I shows the integrated circuit after source and drain anneal. The thermal drive causes the n-type dopant 148 to diffuse and to counter dope the regions 152 from which the implant was blocked turning them from p-type to n-type 156.

Referring again to FIG. 4I, a silicide blocking layer such as silicon dioxide or silicon nitride is deposited over the integrated circuit and a silicide block photoresist pattern 150 is formed on the silicide blocking layer. The silicide blocking layer is etched to leave silicide blocking geometries 154 over the body 96 of the dilution doped polysilicon resistor 52 and over the body 146 of the dilution doped diffused resistor 50. The silicide blocking geometries 154 prevent silicide from forming on and shorting out the bodies 96 and 146 of the dilution doped polysilicon 52 resistor and the dilution doped n-type diffused resistor 50. The STI dielectric geometry 42 prevents the body of the dilution doped nwell resistor 48 from being shorted by the silicide.

Figure 4J:
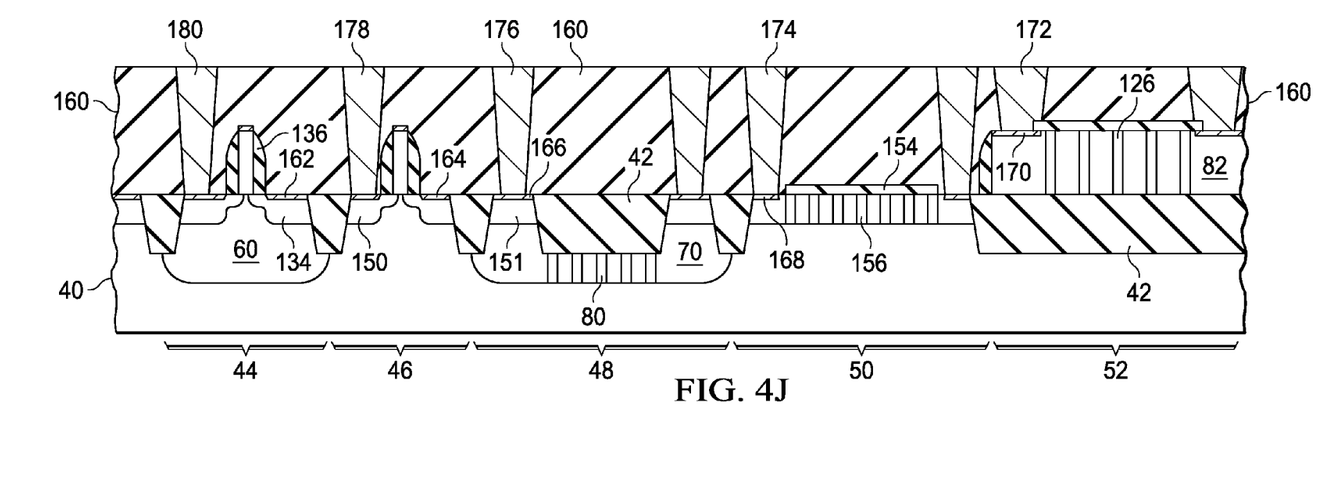

Referring now to FIG. 4J, silicide is formed on the source and drains, 162 and 164, of the PMOS 44 and NMOS 46 transistors, on the heads 166 of the dilution doped nwell resistor 48, on the heads 168 of the dilution doped n-type diffused resistor, and on the heads 170 of the dilution doped polysilicon resistor 52.

As shown in FIG. 4J premetal dielectric layer 160 is deposited over the integrated circuit and contact holes are formed and filled with contact plugs in the conventional manner to provide electrical contact to the source and drains, 180 and 178, of the PMOS 44 and NMOS 46 transistors, electrical contact 176 to the heads 74 of the dilution doped nwell resistor 48, electrical contact 174 to the heads 144 of the dilution doped n-type diffused resistor, and electrical contact 172 to the heads 94 of the dilution doped polysilicon resistor 52.

Metallic interconnection layers and dielectric layers may be formed upon the integrated circuit shown in FIG. 4J to complete the integrated circuit.

Although a p-type substrate with a dilution doped nwell resistor, a n-type dilution doped diffusion resistor, and n-type dilution doped polysilicon resistor is used to illustrate embodiments an n-type substrate with dilution doped p-well resistor and dilution doped p-type diffusion and polysilicon resistors may also be used. The implantations used to form the dilution doped resistors are illustrative. Other implantation steps in the integrated circuit process flow may be used as well to increase or decrease the resistance. One implantation pattern with implant blocking geometries is shown to form the dilution doped resistors, but two or more patterns with blocking geometries may also be used.

Three types of dilution doped resistors (well, diffusion, polysilicon) are formed in the illustrative integrated circuit flow. In an actual integrated circuit process flow one, two or more may be formed. In addition multiple embodiment resistors with different doping types may be formed. For example, a dilution doped nwell resistor and a dilution doped isolated pwell resistor may be formed in the same process flow. Dilution doped n-type and p-type diffused resistors may be formed in the same process flow. Dilution doped n-type and p-type polysilicon resistors may be formed in the same process flow.

The ability to raise the resistance by forming dilution doped resistors, enables resistor structures with smaller resistor area to be formed without additional processing steps or cost. This may provide significant area savings and significant cost reduction to an integrated circuit flow by enabling more integrated circuit die to be formed on an integrated circuit wafer.

Those skilled in the art to which this invention relates will appreciate that many other embodiments and variations are possible within the scope of the claimed invention.

The invention claimed is:

1. A process of forming an integrated circuit, comprising the steps:
   forming a first and a second isolation geometry in a substrate;
   forming a first photoresist pattern over the substrate, the first photoresist pattern having first implant blocking geometries over the first isolation geometry in an n-well resistor area;
   using the first photoresist pattern, implanting first n-type dopants into a first n-well region of the substrate and into the n-well resistor area not blocked by the first implant blocking geometries;
   annealing the first n-type dopants;
   forming a polysilicon layer over the substrate;
   forming a second photoresist pattern on the polysilicon layer, wherein the second photoresist pattern has an opening over a poly resistor region and wherein the second photoresist pattern has second implant blocking geometries over the poly resistor region where a body of the poly resistor is to be formed;

using the second photoresist pattern, implanting second n-type dopants into a portion of the poly resistor region not blocked by the second implant blocking geometries and into a gate region of a transistor;

annealing the second n-type dopants, wherein the second n-type dopants diffuse into a region of the poly resistor region blocked by the second implant blocking geometries;

after annealing the second n-type dopants, patterning and etching the polysilicon layer to form a polysilicon resistor over the second isolation geometry and a transistor gate;

after patterning and etching the polysilicon layer, performing a source and drain extension implant into a source and drain region of a transistor and into head regions of the n-well resistor area;

forming a third photoresist pattern and using the third photoresist pattern to implant third n-type dopants in the source and drain region of the transistor and into the head regions of the n-well resistor area;

annealing the third n-type dopants; and forming silicide regions on the head regions of the n-well resistor area and on head regions of the poly resistor, wherein the third photoresist pattern includes third implant blocking geometries over a diffusion resistor area and wherein implanting third n-type dopants implants into the diffusion resistor area not blocked by the third implant blocking geometries.

2. The method of claim 1, wherein the source and drain extension implant is also into the entire polysilicon resistor.

3. The method of claim 1, wherein forming the silicide region also forms silicide regions on head regions of the diffusion resistor area.

4. The method of claim 3, wherein the third implant blocking geometries span a width of a body of the diffusion resistor area.

5. The method of claim 1, wherein the first implant blocking geometries span a width of a body of the n-well resistor area.

6. The method of claim 1, wherein the second implant blocking geometries span a width of the body of the poly resistor.

7. A process of forming an integrated circuit, comprising the steps:

forming an isolation geometry in a substrate;

forming a first photoresist pattern over the substrate;

using the first photoresist pattern, implanting first n-type dopants into a first n-well region of the substrate;

annealing the first n-type dopants;

forming a polysilicon layer over the substrate;

forming a second photoresist pattern on the polysilicon layer, wherein the second photoresist pattern has an opening over a poly resistor region and wherein the second photoresist pattern has first implant blocking geometries over the poly resistor region where a body of the poly resistor is to be formed;

using the second photoresist pattern, implanting second n-type dopants into a portion of the poly resistor region not blocked by the first implant blocking geometries and into a gate region of a transistor;

annealing the second n-type dopants, wherein the second n-type dopants diffuse into a region of the poly resistor region blocked by the first implant blocking geometries;

after annealing the second n-type dopants, patterning and etching the polysilicon layer to form the poly resistor over the isolation geometry and a gate of the transistor;

after patterning and etching the polysilicon layer, performing a source and drain extension implant into a source and drain region of a transistor and into a diffusion resistor area;

forming a third photoresist pattern having second implant blocking geometries over a portion of the diffusion resistor area;

using the third photoresist pattern, implanting third n-type dopants in the source and drain region of the transistor and into the diffusion resistor area not blocked by the second implant blocking geometries; and annealing the third n-type dopants.

8. The method of claim 7, wherein the source and drain extension implant is also into the entire poly resistor.

9. The method of claim 7, further comprising forming silicide regions on head regions of the diffusion resistor area and on head regions of the poly resistor.

10. The method of claim 7, wherein the second implant blocking geometries span a width of a body of the diffusion resistor area.

11. The method of claim 7, wherein the first implant blocking geometries span a width of the body of the poly resistor.

12. A process of forming an integrated circuit, comprising the steps:

forming a first and a second isolation geometry in a substrate;

forming a first photoresist pattern over the substrate, the first photoresist pattern having first implant blocking geometries over the first isolation geometry in an n-well resistor area;

using the first photoresist pattern, implanting first n-type dopants into a first n-well region of the substrate and into the n-well resistor area not blocked by the first implant blocking geometries;

annealing the first n-type dopants;

forming a polysilicon layer over the substrate;

forming a second photoresist pattern on the polysilicon layer, wherein the second photoresist pattern has an opening over a poly resistor region and wherein the second photoresist pattern has second implant blocking geometries over the poly resistor region where a body of the poly resistor is to be formed;

using the second photoresist pattern, implanting second n-type dopants into a portion of the poly resistor region not blocked by the second implant blocking geometries and into a gate region of a transistor;

annealing the second n-type dopants, wherein the second n-type dopants diffuse into a region of the poly resistor region blocked by the second implant blocking geometries;

after annealing the second n-type dopants, patterning and etching the polysilicon layer to form the poly resistor over the second isolation geometry and a transistor gate;

after patterning and etching the polysilicon layer, performing a source and drain extension implant into a source and drain region of a transistor, into the entire poly resistor, and into head regions of the n-well resistor area;

forming a third photoresist pattern, wherein the third photoresist pattern includes third implant blocking geometries over a diffusion resistor area;

using the third photoresist pattern to implant third n-type dopants in the source and drain region of the transistor, into the diffusion resistor area not blocked by the third implant blocking geometries, and into the head regions of the n-well resistor area;

annealing the third n-type dopants; and forming silicide regions on the head regions of the n-well resistor area, head regions of the diffusion resistor area, and on head regions of the poly resistor.

13. The method of claim 12, wherein the third implant blocking geometries span a width of a body of the diffusion resistor area.

14. The method of claim 12, wherein the first implant blocking geometries span a width of a body of the n-well resistor area.

15. The method of claim 12, wherein the second implant blocking geometries span a width of the body of the poly resistor.

\* \* \* \* \*